(12) United States Patent
Auerbach et al.

(10) Patent No.: US 7,807,931 B2
(45) Date of Patent: Oct. 5, 2010

(54) ELECTRICAL COMPONENT ON A SUBSTRATE AND METHOD FOR PRODUCTION THEREOF

(75) Inventors: Franz Auerbach, Soest (DE); Bernd Gutsmann, Weyhe (DE); Thomas Licht, Warstein (DE); Norbert Seliger, München (DE); Karl Weidner, München (DE); Jörg Zapf, München (DE)

(73) Assignee: Siemens Aktiengesellschaft, Munich (DE)

( * ) Notice: Subject to any disclaimer, the term of this patent is extended or adjusted under 35 U.S.C. 154(b) by 1006 days.

(21) Appl. No.: 10/551,207

(22) PCT Filed: Mar. 9, 2004

(86) PCT No.: PCT/EP2004/002424

§ 371 (c)(1),
(2), (4) Date: Aug. 17, 2006

(87) PCT Pub. No.: WO2004/086502

PCT Pub. Date: Oct. 7, 2004

(65) Prior Publication Data

US 2007/0175656 A1    Aug. 2, 2007

(30) Foreign Application Priority Data

Mar. 28, 2003  (DE) .................................. 103 14 172

(51) Int. Cl.
*H05K 1/16* (2006.01)
(52) U.S. Cl. ....................................... 174/260; 257/735

(58) Field of Classification Search ................. 174/260, 174/267; 257/735, 736, 750
See application file for complete search history.

(56) References Cited

U.S. PATENT DOCUMENTS

| 3,978,578 A | 9/1976 | Murphy |
| 4,937,707 A | 6/1990 | McBride et al. |

(Continued)

FOREIGN PATENT DOCUMENTS

DE            196 17 055 C1     6/1997

(Continued)

OTHER PUBLICATIONS

Harmann, G., Wire Bonding in Microelectronics Materials, Processes, Reliability, and Yield, 2nd Edition, McGraw-Hill; 1998; pp. 1-41.

(Continued)

*Primary Examiner*—Jeremy C Norris
(74) *Attorney, Agent, or Firm*—Staas & Halsey LLP (57) ABSTRACT

In an arrangement having at least one substrate, at least one electrical component is disposed on a surface section of the substrate and is provided with an electrical contact area, and at least one electrical contact lug has an electrical connecting area electrically contacting the contact area of the component. The connecting area of the contact lug and the contact area of the component are interconnected so that at least one zone of the contact lug protrudes beyond the area of the component. The contact lug is provided with at least one electrically conducting film while the electrically conducting film is provided with the electrical connecting area of the contact lug. The arrangement is particularly useful for large-area, low-inductive contacting of power semiconductor chips, as it allows for high current density.

4 Claims, 4 Drawing Sheets

U.S. PATENT DOCUMENTS

| | | | |
|---|---|---|---|
| 5,027,192 | A | 5/1991 | Kloucek |
| 5,304,843 | A * | 4/1994 | Takubo et al. ............... 257/670 |
| 5,452,182 | A | 9/1995 | Eichelberger et al. |
| 5,616,886 | A | 4/1997 | Romero et al. |
| 5,637,922 | A | 6/1997 | Fillion et al. |
| 5,856,913 | A | 1/1999 | Heilbronner |
| 6,687,108 | B1 * | 2/2004 | Anthony et al. ............. 361/118 |

FOREIGN PATENT DOCUMENTS

| | | |
|---|---|---|
| EP | 0 380 906 | 8/1990 |
| EP | 0 473 929 A1 | 3/1992 |
| FR | 2 382 101 | 9/1978 |
| JP | 7203686 | 8/1995 |
| JP | 8335665 | 12/1996 |
| JP | 2002190571 | 5/2002 |
| WO | WO 95/06946 | 3/1995 |

OTHER PUBLICATIONS

Temple, V.; "SPCO's ThinPak Package, an Ideal Building Block for Power Modules and Power Hybrids"; IMAPS 99 Conference, Chicago 1999; pp. 642-646.

S. Haque et al., "An Innovative Technique for Packaging Power Electronic Building Blocks Using Metal Posts Interconnected Parallel Plate Structures"; IEEE Transactions on Advanced Packaging, vol. 22, No. 2, May 1999; pp. 136-144.

X. Liu et al.; "Packaging of Integrated Power Electronics Modules Using Flip-Chip Technology"; Applied Power Electronics Conference and Exposition, APEC'2000; pp. 290-296.

C. Gillot et al.; "A New Packaging Technique for Power Multichip Modules"; IEEE Industry Applications Conference IAS 1999; pp. 1765-1769.

G.-Q. Lu, "3-D, Bond-Wireless Interconnection of Power Devices in Modules Will Cut Resistance, Parasitic and Noise"; PCIM, May 2000; pp. 40, 46-48, 65, 66, 68.

H.-J. Krokoszinski, "Foil-Clips for Power Module Interconnects"; Hybrid Circuits, vol. 35, Sep. 1992; pp. 28-30.

"Improved Method for C-4 Chip Join"; IBM Technical Disclosure Bulletin, vol. 31, No. 6, Nov. 1998; pp. 335-336.

* cited by examiner

ELECTRICAL COMPONENT ON A SUBSTRATE AND METHOD FOR PRODUCTION THEREOF

CROSS REFERENCE TO RELATED APPLICATIONS

This application is based on and hereby claims priority to German Application No. 10314172.3 filed on Mar. 28, 2003, the contents of which are hereby incorporated by reference.

BACKGROUND OF THE INVENTION

1. Field of the Invention

The invention relates to a arrangement with at least one substrate, at least one electrical component that is disposed on a surface section of the substrate with an electrical contact surface and at least one electrical contact lug with an electrical connection surface for electrical contacting of the contact surface of the component with the connection surface of the contact lug and the contact surface of the component being connected to each other such that at least one area of the contact lug protrudes beyond the contact surface of the component. In addition a method for production of the arrangement is specified.

2. Description of the Related Art

An arrangement of the type described is known from U.S. Pat. No. 5,616,886. The component is an aluminum layer applied to a section of the surface of the substrate. For electrical contacting of the layer composed of aluminum an electrical terminal in the form of a contact lug is employed. A further component named in U.S. Pat. No. 5,616,886 is a power semiconductor chip, for example an IGBT (Insulated Gate Bipolar Transistor). This component is contacted via its surface without the use of bond wires. Details of this process are not specified.

The most widely used technology for contacting of power semiconductor chips with one another is thick wire bonding (see Harmann, G., "Wire Bonding in Microelectronics, Materials, Processes, Reliability and Yield", Mc Graw Hill 1998). Ultrasound energy is used here to make a permanent connection between the wire made of Al, which typically has a diameter of a few 100 μm and the contact surface, which consists of Al on the chip and Cu on the power module, realized via an intermetallic connection.

As an alternative to bonding further methods such as Thin-Pak are publicized (see Temple, V., "SPCO's ThinPak Package, an Ideal Block for Power Modules and Power Hybrids", IMAPS 99 Conference, Chicago 1999). In this case the chip surface is contacted via a solder which is inserted via holes in a ceramic plate.

With MPIPPS (Metal Posts Interconnected Parallel Plate Structures, see Haque S., et al., "An Innovative Technique for Packaging Power Electronic Building Blocks Using Metal Posts Interconnected Parallel Plate Structures", IEEE Trans Adv. Pckäg., Vol. 22, No. 2 May 1999) the contacts are established by means of soldered copper posts.

Another method for contacting is by using solder bumps in flip chip technology (Liu, X., et al., "Packaging of Integrated Power Electronics Modules Using Flip-Chip Technology", Applied Power Electronics Conference and Exposition, APEC'2000). This also enables heat to be dissipated more effectively since the power semiconductors can be soldered on the upper and lower side to DCB substrates (DCB stands for Direct Copper Bonding) (see Gillot, C. et al., "A New Packaging Technique for Power Multichip Modules", IEEE Industry Applications Conference IAS'99, 1999).

A large-area contacting on vapor-deposited Cu leads is presented in (Lu, G.-Q., "3-D, Bond-Wireless Interconnection of Power Devices in Modules Will Cut Resistance, Parasitics and Noise", PCIM May 2000, pp. 40-68), where the isolation of the conductor tracks is undertaken by means isolator deposited from the vapor phase (CVD-method) (Power Module Overlay Structure).

Contacting by means of a structured film using a gluing or soldering process has been publicized in Krokoszinski, H.-J., Esrom, H., "Film Clip for Power Module Interconnects", Hybrid Circuits 34 September 1992).

SUMMARY OF THE INVENTION

The types of contacting shown are as a rule subject to inductance. Electrical activation of the contactings gives rise to a relatively high inductance. An object of the invention is thus to specify a contacting of an electrical component, which when activated electrically, leads to a lower inductance compared to the known prior art.

To achieve this object an arrangement is specified with at least one substrate, at least one electrical component disposed on a section of the surface of the substrate, with an electrical contact surface and at least one electrical contact lug with an electrical connection surface for electrical contacting of the contact surface of the component, with the connection surface of the contact lug and the contact surface of the component being connected to each other such that there is an area which at least protrudes beyond the contact surface of the component. In the arrangement the contact lug features at least one electrically-conductive film and the electrically-conductive film features the electrical connection surface of the contact lug.

To achieve the object a method for producing an arrangement is also specified, with the following: a) Provision of a substrate with an electrical component with an electrical contact surface and b) Creation of electrical contacting by bringing together the contact surface of the component and the connection surface of the electrically-conductive film of the contact lug such that at least an area of the electrically-conductive film of the contact lug protruding over the contact surface of the component is produced.

Any organic-based or inorganic-based circuit carriers can be used as substrates. Such substrates are for example PCB (Printed Circuit Board), DCB, IM (Insulated Metal), HTCC (High Temperature Cofired Ceramics) and LTCC (Low temperature Cofired Ceramics) substrates.

The electrically-conductive film functions for example as a load connection. The load connection serves as electrical supply lead for the electrical component. To this end the component is connected via the electrically-conductive film for example to what is known as a bus structure which is used for electrical activation of a number of components.

The electrically-conductive film features an electrically-conductive material formed into a thin track. The film features an electrical conductor embodied as its surface. For this purpose the film can consist partly or completely of the electrically-conductive material. The shape of the film is in this case able to be changed to a certain extent. The film can in this case essentially be present in a planar form. It is also conceivable for the film to be angled in relation to the contact surface of the component or the contact surface of the film. The thickness of the film is in the μm range. This means that the film can range from a few μm to several 100 μm thick. In particular film thicknesses of up to 500 μm are possible.

The electrical component can be any given passive or active component. The passive component is for example a conductor structure. Preferably the component is a semiconductor chip and especially a power semiconductor chip. The power semiconductor chip is for example a MOSFET with relatively large-area SourceGate—and Drain chip surfaces (physical connections of the MOSFET). To guarantee contacting with a high current density for these chip surfaces the chip surfaces are contacted over a large area. A lateral dimension of the contact surface is relatively large. For example each of the contact surfaces forms at least 60%, preferably however at least 80% of the relevant chip surface. For electrical contacting a thin, electrically-conductive film with a large contact surface is used. The outstanding feature of the electrically-conductive film is its relatively low inductance. The component can be contacted at low inductance. The flat shape of the contact lug and the associated relatively large surface means that heat can be well linked to the environment. This makes an increased current density possible. The relatively large surface in comparison to the cross-section of the contact lug is especially advantageous for the activation of the contact lug with higher frequencies. At higher frequencies a current displacement (skin effect) is caused. Despite the skin effect good electrical conductivity is guaranteed with the contact lug.

In a particular embodiment the electrically-conductive film features a laminated connection with at least two electrical conductor layers and at least one electrical insulation layer arranged between the conductor layers. Preferably the conductor layers and the insulation layer of the laminated interconnect are embodied and arranged in relationship to each other so that through electrical activation of the conductor layers a magnetic field can be created such that the magnetic fields mutually weaken. The magnetic fields are almost extinguished by negative interference This preferably succeeds by the line layers of the laminated interconnect being arranged essentially in a coplanar manner to each other. The conductor layers are activated such that the current directions in the conductor layers are in opposite directions to each other. The insulation layer is embodied such that there cannot be any electrical short circuit between the conductor layers. To arrive at an efficient screening of the magnetic fields and thereby to a further lowering of the inductance of the electrical terminal, it can be advantageous to use a laminated interconnect made of a number of conductor layers and insulation layers arranged between them. In this case adjacent line layers are activated with current with opposite directions.

In accordance with a special embodiment of the method for production of the arrangement a connection method from the group soldering and/or welding and/or gluing are used to bring together the contact surface of the component and the contact surface of the electrically-conductive film. Gluing is undertaken for example with an electrically-conductive adhesive. With this connection method a connection is made between the contact surface of the component and the contact surface of the electrically-conductive film.

The electrically-conductive film can only consist of electrically-conductive material, for example copper. Especially an electrically-conductive film with a laminated interconnect with at least one electrical insulation layer and at least one electrical conductor layer to form the connection surface of electrically-conductive film. The insulation layer can function as a flexible carrier for the conductor layer. For example the laminated interconnect may be formed of a plastic film forming the insulation layer onto which a layer of copper is applied. A laminated interconnect with alternate conductor layers and insulation layers stacked above each other is also conceivable.

In a further embodiment, to provide the substrate with the electrical component, the electrical contact surface of the component is created with the following: c) Application of an electrical insulating film to the substrate and the component and d) Creation of a window in the insulating film, where the contact surface of the component is revealed.

The insulating film is preferably applied by laminating it on in a vacuum. The laminating is advantageously undertaken in a vacuum press. Conceivable methods are vacuum swaging, hydraulic vacuum pressing, vacuum gas pressure pressing or similar lamination procedures. The pressure is advantageously applied isostatically. The lamination is undertaken for example at temperatures of 100° C. to 250° C. and a pressure of 1 bar to 10 bar. The precise process parameters of the application of the lamination, that is pressure, temperature, time etc., depend amongst other things on the topology of the substrate, of the plastic material of the insulating film and the thickness of the insulating film. The result of laminating on the insulating film is that the insulating film provides a close covering for the surface with the contact surface or surfaces and adheres to this surface. In summary the laminating-on of the insulating film has the following advantages:

Use at high temperatures. An insulating film made of polyamide for example is heat-resistant up to 300° C.

Low process costs, e.g. by comparison with deposition of the insulator from the vapor phase.

High insulation field strengths are possible by using thicker layers of insulation.

Laminating on the insulation layers makes a higher throughput possible. For example DCB substrates can be processed in the wafer.

Any size of window and thereby any size of contact surface can be created in the laminated-on insulating film.

The laminated-on insulating film is outstanding because of its homogeneous insulation properties, since entry of air is prevented by processing the film in the vacuum.

With a semiconductor chip almost the entire contact surface of the chip can be used so that high currents can be obtained. In such cases chip contact surfaces of 30 mm2 to 300 mm2 can be implemented.

The flat contacting allows the chips to be activated homogeneously.

The inductance of the contact with one contact surface is smaller than with thick wire bonding because of the planar geometry.

The contacting leads to higher reliability for vibration and mechanical shock stresses.

By comparison with rival contacting methods, a higher resistance to load change can be realized because of lower thermo-mechanical voltage.

A number of wiring planes are accessible.

The planar connection technology described only demands a small component height. The result is a more compact design.

With multi-layer connection planes wide-area metallization layers can be implemented for screening. This has a very positive effect in particular on the EMC (Electromagnetic Compatibility) behavior of the circuit (noise emissions, noise immunity).

In a particular embodiment the insulating film applied is used as the insulating layer of the laminated interconnect. For this, in a particular embodiment, electrically-conductive material is applied to the insulating film to form the electrical conductor layer of the laminated interconnect after the insulating film has been applied. In this case any application or deposition method can be used. The electrically-conductive material is applied over the surface. For example a physical or chemical deposition of the electrically-conductive material is undertaken here. These types of physical procedure are sputtering and Physical Vapor Deposition, (PVD). The chemical separation can be undertaken in a gaseous phase (Chemical Vapor Deposition, CVD) and/or liquid phase: (Liquid Phase: Chemical Vapor Deposition). It is also conceivable that initially one of these procedures is used to apply a thin electrically-conductive sublayer, onto which a thicker electrically-conductive sublayer can be electrically deposited.

In a particular embodiment the insulating film is applied to the component in such a way that one area of the insulating film which protrudes over at least the contact surface of the component is created. This area of the insulating film forms the area of the contact lug which protrudes beyond the contact surface.

The insulating film is designed in this case such that a height difference of up to 2000 µm can be overcome. The height difference is caused by factors such as the topology of the substrate and by the components arranged on the substrate, for example semiconductor chips.

The insulating film can be made of any given plastic For example any thermoplastics, duroplastics or mixtures thereof are conceivable. A film made of a plastic material based on polyamide (PI), polyethylene (PE), polyphenole, polyetheretherketone (PEEK) and/or epoxy is preferably and advantageously used as an insulating film in the inventive method. The insulating film can in this case feature a number of sublayers made of different plastics in each case. The insulating film can in this case feature an adhesive coating to improve adhesion to the surface of the substrate or the component.

The thickness of the insulating film is selected from the µm range and can range from a few µm to several 100 µm. For example the film thickness is selected from the range of 10 µm to 500 µm. Preferably an insulating film with a film thickness of 25 µm to 150 µm is used.

After the application of the lamination a tempering stage is especially performed. The adhesion of the insulating film to the surface of the substrate and/or of the component is improved by temperature treatment.

In a further embodiment the application (with or without a temper step) is repeated until such time as a specific film thickness of the applied insulating film is achieved. For example thinner insulating films are processed into a laminated-on insulating film of greater thickness. These insulating films are advantageously formed of a type of plastic material. Also conceivable in this case is that insulating films from a number of different plastic materials are used. The result is a laminated applied insulating film.

In accordance with a particular embodiment the insulating film can be removed by laser ablation to create the window in the insulating film. A wavelength of a laser used for this purpose amounts to between 0.1 µm and 11 µm. The power of the laser amounts to between 1 W and 100 W. For example a $CO_2$ laser with a wavelength of 9.24 µm is used. The window is opened in this case without damaging any aluminum chip contacts which might lie below the layer of electrically-isolating material. This chip contact forms the contact surface of the component. The size of the window preferably amounts here to more than 80%, but less than 99.9% of the size of the side and/or the surface (chip surface) of the component. The size of the window is advantageously selected to range between 80% and 95% of the size of the side and/or the surface of the component.

In accordance with a further embodiment a photo-sensitive insulating film is used and to create the window in the insulating film a photo-lithographic process is undertaken. The photosensitive insulating film is a photo film. The photo-lithographic process includes exposing the photosensitive insulating film, developing the exposed and/or non-exposed parts of the insulating film and removing the exposed or non-exposed parts of the insulating film.

After the window is opened in the insulating film a cleaning step is performed where necessary in which film residues are removed. The cleaning step is undertaken for example using wet chemistry. A plasma cleaning method is especially conceivable.

In a further embodiment a conductor layer having a number of sublayers of different electrically-conductive materials arranged above one another is used. For example different metal layers are applied above one another. The number of the sublayers or metal layers especially amounts to between 2 and 5. A sublayer functioning for example as a diffusion barrier can be integrated by the electrical conducting layer constructed from a number of sublayers. Such a sublayer consists for example of a titanium-tungsten alloy (TiW). Advantageously, with a multi-layer construction, a sublayer which promotes adhesion or improves it is applied directly to the surface to be contacted. Such a sublayer consists of titanium for example.

The method described with the individual steps can be performed once.

It is especially conceivable that, to produce a multi-layer arrangement, the steps in which the insulating film is applied, the window is created in the insulating film and/or the electrical contacting is created can be performed several times.

After the surface contacting of the contact surface of the component with the aid of the contact lug there can be provision for the production of at least one conductor track of the arrangement. The conductor track can in this case be applied to the existing insulating film. In particular a structuring of the insulating film is performed to create the conductor track. This means that the conductor track is created in this insulating film. The conductor track is used for example for the electrical contacting of a semiconductor chip.

The track is usually structured in a photo-lithographic process. To this end a photo resist can be applied to the electrically-conductive layer, dried and subsequently exposed and developed. Under some circumstances a tempering step follows in order to stabilize the photo resist which has been applied against subsequent treatment processes. Conventional positive and negative resists (coating materials) may be used as photo resists. The photo resist is for example applied using a deposition or dipping process. Electro-deposition (electrostatic or electrophoretic deposition) is also conceivable.

Photo-sensitive films can also be used for structuring, the films being applied as a laminate and exposed and developed in a comparable way to the applied photo resist layer.

To create the conductor track the process employed can be as follows for example: In a first substep an electrically-conductive film layer is applied and a photo-resist layer is structured on it. In a subsequent substep a further metallization is applied to the conductor track created. The conductor track is strengthened through the further metallization. For example copper is electrically deposited to a thickness of 1 µm to 400 µm on the conductor track created by the structuring. The copper can also be deposited with greater thicknesses of up to 1 mm. This enables the electrically applied copper layer to function additionally as an efficient heat sink. After the deposition of the copper the photoresist or the laminated-on insulating film are dissolved. This is undertaken for example with an organic solvent, an alkaline developer or suchlike. Through subsequent differential etching the surface metallic conducting layer not strengthened by the metallization is removed again. The strengthened conductor track is retained.

With the contact lug any contact surfaces of any electrical component can be contacted via their surfaces. In particular large-area low-inductance electrical contacting of semiconductor chips and especially of power semiconductor chips is possible. The resulting surface electrical connection leads to a high current carrying capacity and reduced resistive loss. The use of a contact lug with conductor layers arranged in a coplanar manner in particular leads to low-induction contacting of the component. One of the consequences of this is reduced EMF faults.

BRIEF DESCRIPTION OF THE DRAWINGS

These and other objects and advantages of the present invention will become more apparent and more readily appreciated from the description below of the preferred embodiments, taken in conjunction with the accompanying drawings which are schematic and do not represent true-to-scale illustrations.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

Figure 1:
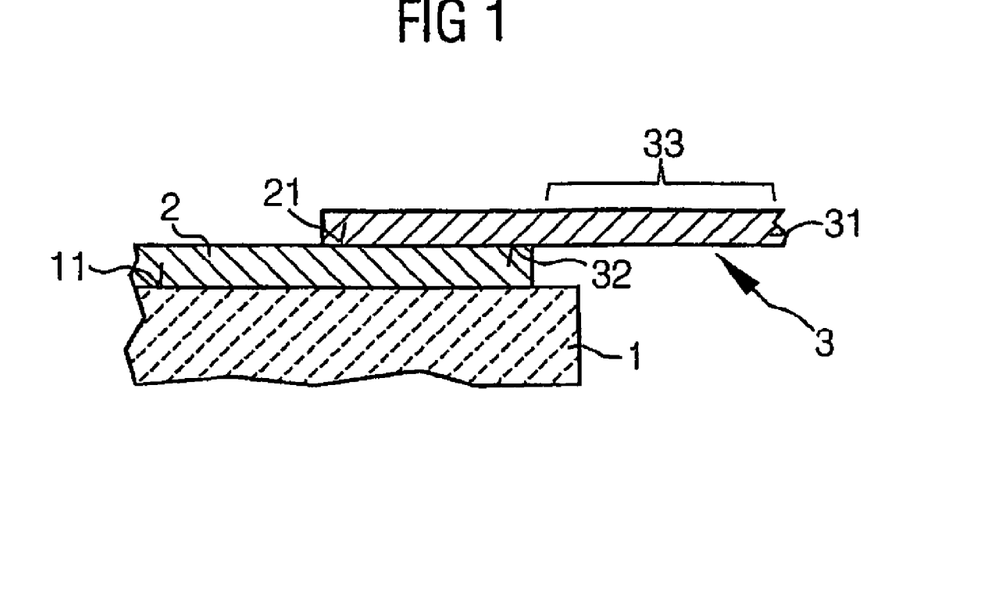
FIG. 1 is a cross-section view of an inventive arrangement.
Figure 2:
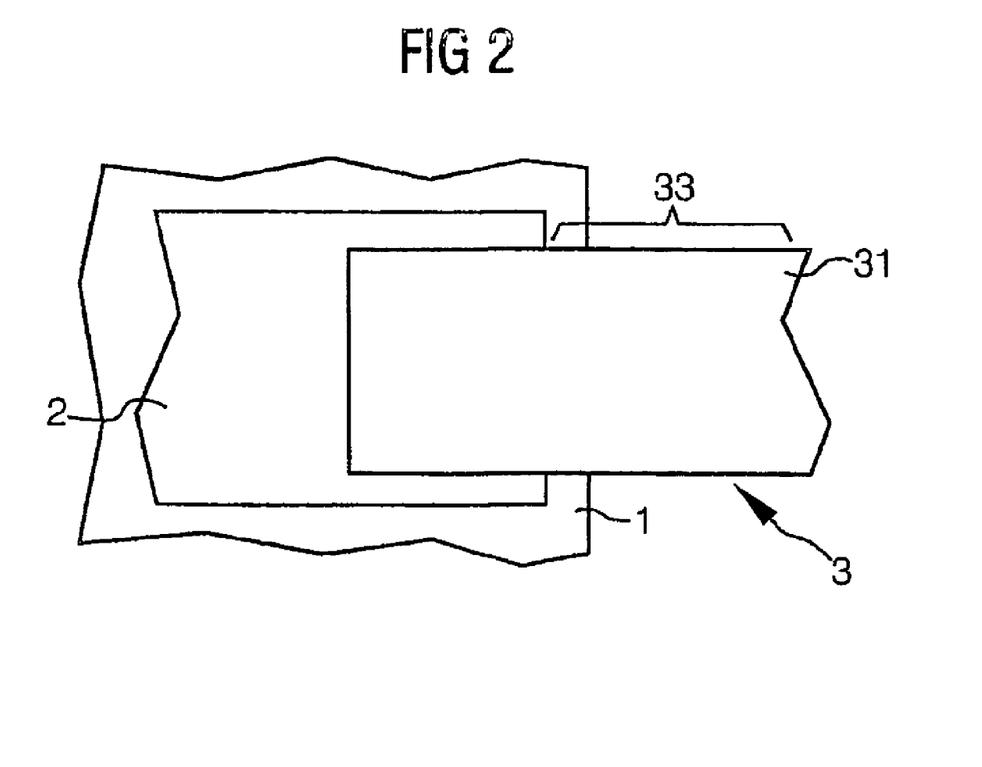
FIG. 2 is a plan view of the arrangement in FIG. 1.

The arrangement features a substrate (circuit carrier) 1, an electrical component 2 disposed on the surface section 11 of the substrate 1 and an electrical contact lug 3 for electrical contacting of the component 2. The substrate 1 consists of a ceramic material. The component 2 is a conductor structure. In an alternative embodiment to the above, the electrical component 2 is a power semiconductor. The electrical contact surface 21 is formed in this case on a chip contact surface.

The electrical connection surface 32 of the contact lug 3 and the contact surface 21 of the component 2 are connected to each other such that there is an area 33 of the contact lug 3 protruding at least beyond the contact surface 21 of the component 2. In the arrangement the contact lug 3 features at least one electrically-conductive film 31 and the electrically-conductive film 31 features the electrical connection surface 32 of the contact lug 3.

Figure 3A:
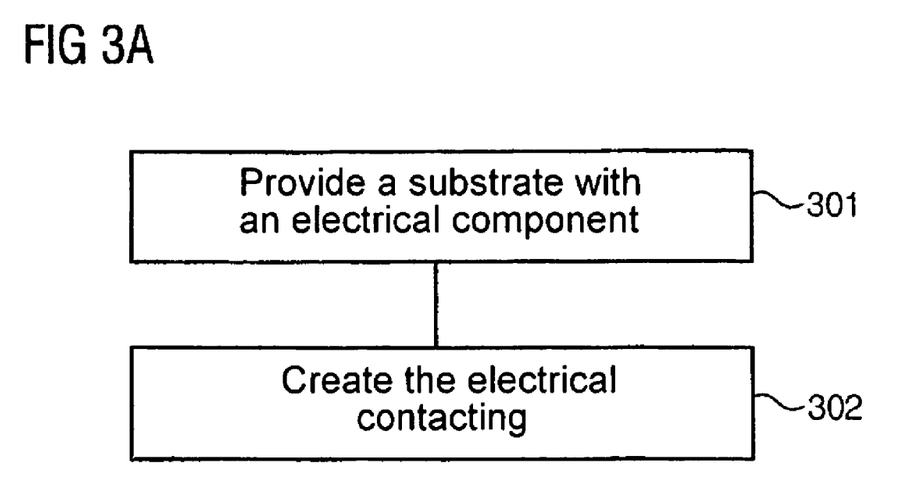
FIGS. 3A and 3B are flowcharts of a method for producing the arrangement.

To produce the arrangement, in a first step substrate 1 with the component 2 with the electrical contact surface 21 is prepared (FIG. 3A, reference symbol 301). Subsequently the electrical contacting of the electrical contact surface 21 is undertaken by bringing together the connection surface 21 of the electrical contact lug 3 and the contact surface 21 of the component 2 (FIG. 3I, reference symbol 302).

Figure 3B:
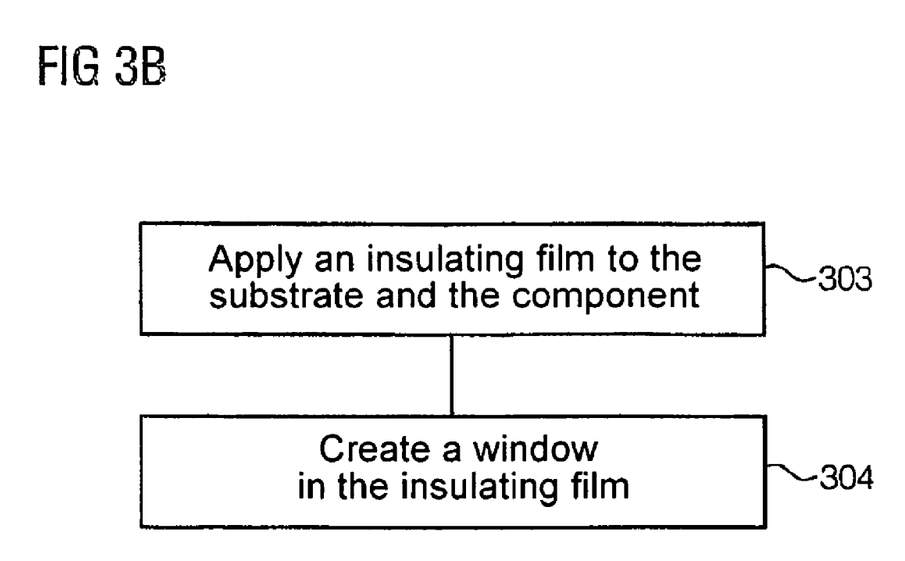

To provide the substrate with the component 2 with the contact surface 21 an electrical insulating film 4 is applied to the substrate 1 and the component 2 (FIG. 3B, reference symbol 302) and a window is created in the insulating film 4, which reveals the contact surface of the component (FIG. 3B, reference symbol 303).

Exemplary Embodiment 1

Figure 4:
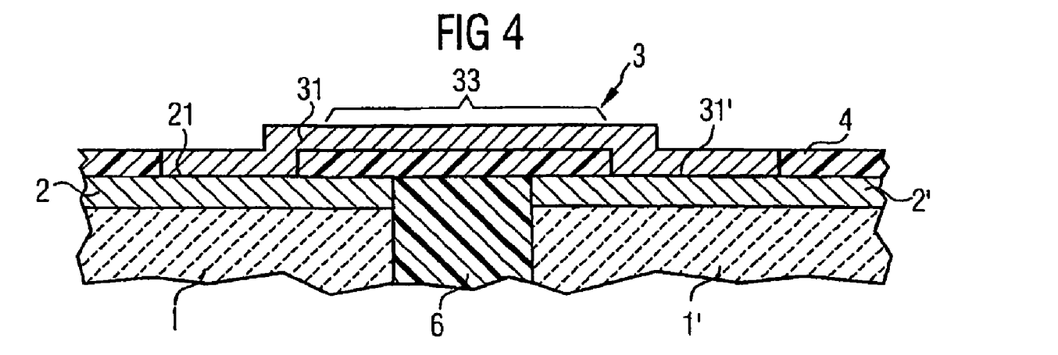
FIGS. 4 to 8 are cross-section views of different exemplary embodiments of the arrangement.

The electrical contact lug 3 with the . . . functions as an electrical intersubstrate connection (FIG. 4). A number of substrates 1 and 1' with electrical components 2 and 2' are arranged on a carrier not shown. With the aid of the contact lug 3 and area 33 of the contact lug protruding beyond the contact surface the contact surfaces 21 and 21' of the components 2 and 2' are connected electrically-conductively to each other. Between the substrates 1 and 1' an insulation 6 of the electrical components 2 and 2' of the substrates 1 and 1' is provided. The insulation 6 consists of Teflon for example. The insulation 6 also serves to avoid adhesion during the production process.

The procedure to produce the intersubstrate connection is as follows: Initially the substrates 1 and 1' with the components 2 and 2' are arranged spaced at a particular distance from each other on the support not shown. In the space predetermined by the distance between them a small plate made of Teflon is laid with a height which roughly corresponds to the height of the substrates 1 and 1' with the components 2 and 2'. Subsequently an insulating film 4 is laminated onto the components 2 and 2'. In the next step the contact surfaces 21 and 21' of the components 2 and 2' is revealed by creating corresponding windows in the insulating film 4. Finally on the revealed contact surfaces 21 and 21' and on the insulating film 4 electrically-conductive material is applied such that an electrical connection between the contact surfaces 21 and 21' is created.

In a further development of this exemplary embodiment the insulation 6 made from Teflon can be removed after the application of the electrically-conductive material.

Exemplary Embodiment 2

Figure 5:
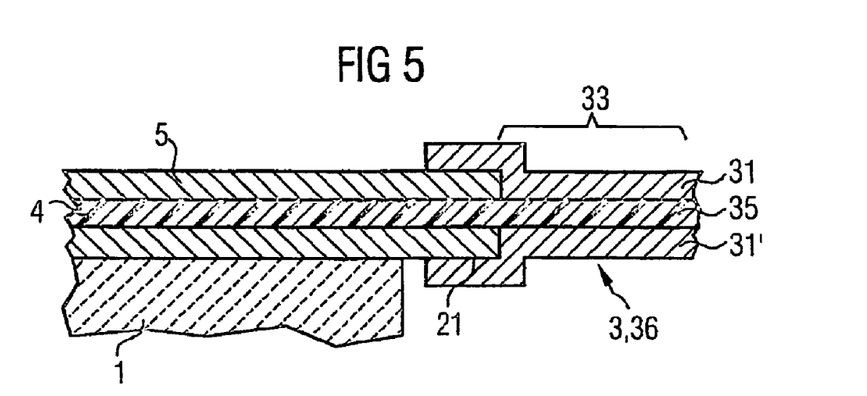

The electrical contact lug 3 functions as a load connection to a bus structure not shown (FIG. 5). In this case the contact lug 3 features two conductor layers 31 and 31' in a coplanar arrangement. Between the conductor layers 31 and 31' there is an insulation layer 35. The conductor layers 31 and 31' and the insulation layer 35, which form a laminated interconnect 36 are dimensioned such that through the electrical activation of the conductor layers 31 and 31' magnetic fields are created which lead to a low inductance. The insulating layer 35 is made from an insulating film 34 which is used during the production process of the surface contactings of the contact surface 21. A conductor track 5 is applied to the insulating film 4. The component 2 and the conductor track 5 are each electrically contacted with one of the conductor layers 31 and 31'.

Exemplary Embodiment 3

Figure 6:
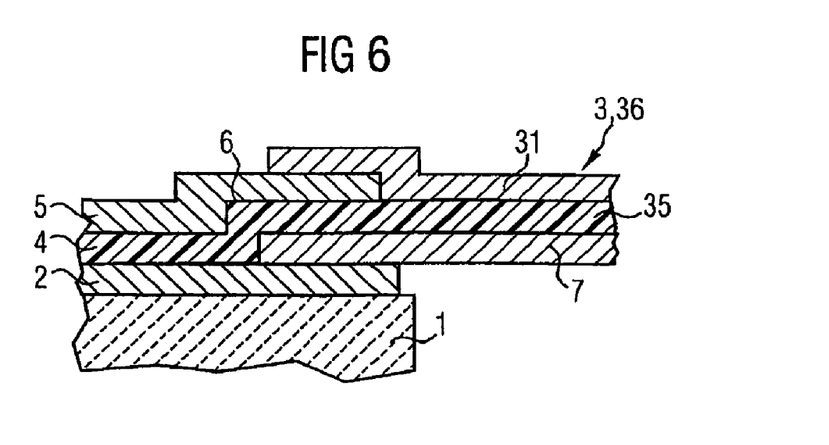

Unlike the previous example the insulating film 4 features a stage 6 (FIG. 6). To produce this type of arrangement, in a first step a conductor structure 7 is arranged on a substrate 1 with electrical component 2 provided such that the component 2 is electrically contacted via the conductor structure 7. The conductor structure 7 is made for example from a copper film or a copper sheet. Thereafter an insulating film 4 is laminated onto the component 2 and the conductor structure 7. Subsequently a conductor track 5 is applied to the laminated-on insulating film 4. Finally a conductor layer 31 is applied to the insulating film 4 such that the electrical contact lug 3 is formed and the conductor track 5 electrically contacted. From the insulating film 4 the insulating layer 35 of the laminated interconnect 36 is formed.

Exemplary Embodiment 4

Figure 7:
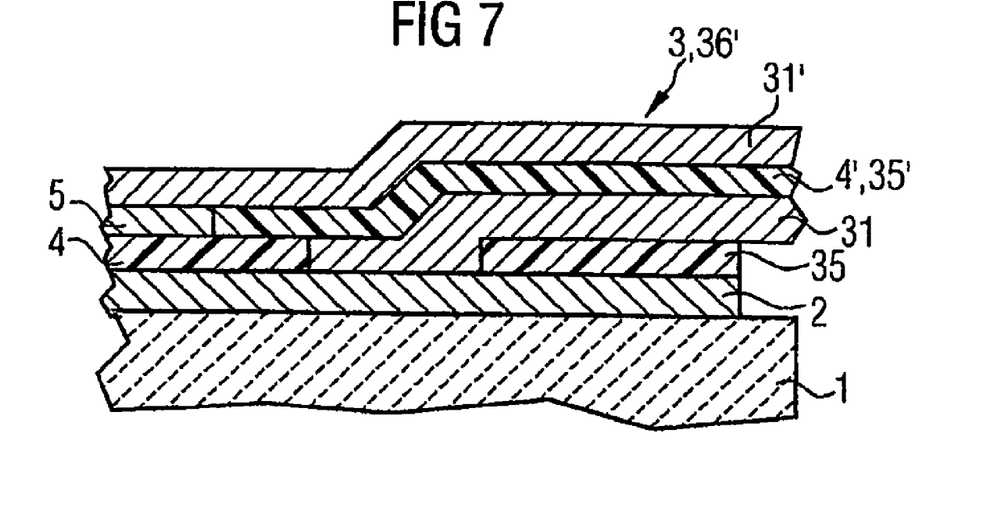

An insulating film 4 is applied to the component 2. After the application a window is created, which reveals the contact surface of the component 2 (FIG. 7). Then electrically-conductive material is applied to form the conductor layer 31. In the next step a further insulating film 4' is applied. After creation of a conductor track 5 on the insulating film 4 finally a further electrical conductor layer 31' is applied. The result is an electrical contact lug 3 with conductor layers 31 and 31' in a coplanar arrangement. The insulating layers 35 and 35' are the result of the application of the insulating films 4 and 4'.

Exemplary Embodiment 5

Figure 8:
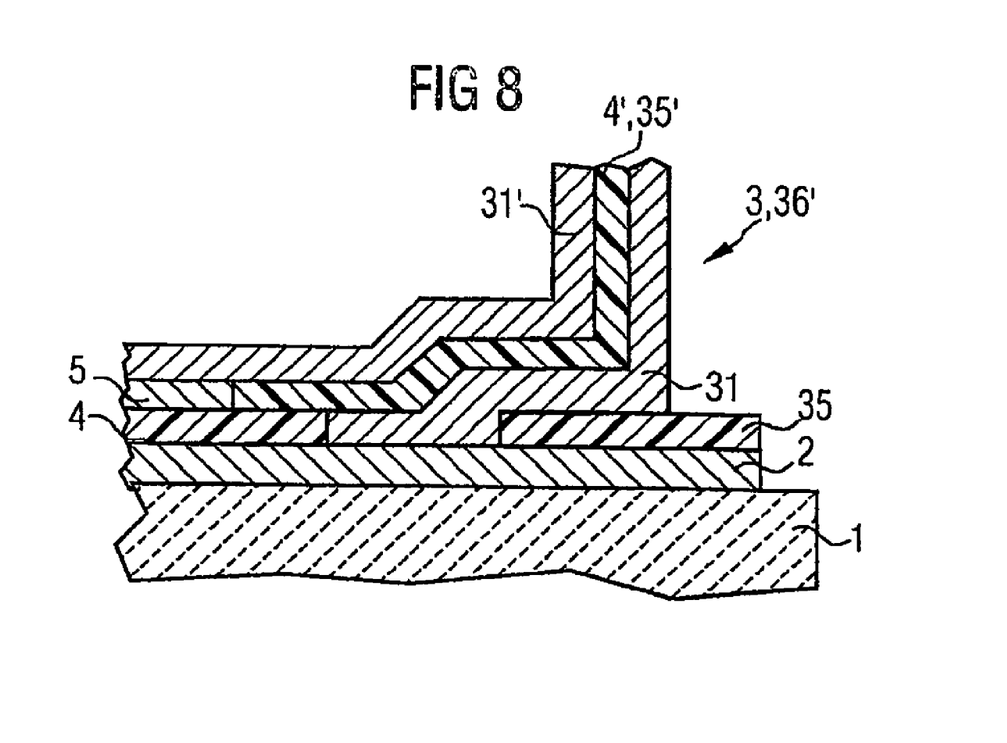

Unlike in the previous exemplary embodiment the contact lug 3 is angled (FIG. 8). The contact lug 3 can be bent at any angle in relation to the contact surface of the component or the surface of the substrate. To produce the angled contact lug 3 the laminated interconnect 36 of the contact lug 3 is bent away from the substrate surface.

An angled contact lug is provided in further exemplary embodiments not described in any greater detail which are derived from the exemplary embodiments described above.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide* v. *DIRECTV*, 69 USPQ2d 1865 (Fed. Cir. 2004).

The invention claimed is:

1. An arrangement, comprising:
    a substrate;
    an electrical component arranged on a surface section of the substrate, the electrical component having an electrical contact surface; and
    an electrical contact lug including
        an electrically-conductive film having an electrical connection surface in electrical contact with the electrical contact surface of the electrical component, and
        an area protruding beyond the electrical contact surface of the electrical component,
    wherein the electrically-conductive film is a laminated interconnect having two electrical conductor layers and an electrical insulation layer arranged between the two electrical conductor layers, and
    wherein the two electrical conductor layers and the electrical insulation layer of the laminated interconnect are arranged to produce opposing magnetic fields in the two electrical conductor layers upon electrical activation.

2. An arrangement according to claim 1, wherein the two electrical conductor layers of the laminated interconnect are substantially in a coplanar arrangement.

3. An arrangement according to claim 2, wherein the electrical component is a power semiconductor chip.

4. An electronic device, comprising:
    a substrate;
    a power semiconductor chip arranged on a surface section of the substrate, the power semiconductor chip having an electrical contact surface; and
    an electrical contact lug having
    a laminated interconnect as an electrically-conductive film in electrical contact with the electrical contact surface of the power semiconductor chip, the laminated interconnect having at least two electrical conductor layers, which are substantially in a coplanar arrangement, and at least one electrical insulation layer arranged between the at least two electrical conductor layers, the at least two electrical conductor layers and the at least one electrical insulation layer being arranged to produce opposing magnetic fields in the at least two electrical conductor layers upon electrical activation, and
    an area extending beyond the electrical contact surface of the power semiconductor chip.

* * * * *